United States Patent
Zhang et al.

(10) Patent No.: US 9,741,819 B2
(45) Date of Patent: Aug. 22, 2017

(54) TRANSISTOR DEVICE AND FABRICATION METHOD

(71) Applicant: Semiconductor Manufacturing International (Shanghai) Corporation, Shanghai (CN)

(72) Inventors: Haiyang Zhang, Shanghai (CN); Xuan Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 1 day.

(21) Appl. No.: 14/849,641

(22) Filed: Sep. 10, 2015

(65) Prior Publication Data

US 2016/0087075 A1    Mar. 24, 2016

(30) Foreign Application Priority Data

Sep. 24, 2014   (CN) .......................... 2014 1 0491230

(51) Int. Cl.

| | |
|---|---|
| *H01L 21/3065* | (2006.01) |
| *H01L 21/311* | (2006.01) |
| *H01J 37/32* | (2006.01) |
| *H01L 27/11* | (2006.01) |
| *H01L 29/49* | (2006.01) |
| *H01L 21/8238* | (2006.01) |
| *H01L 21/82* | (2006.01) |
| *H01L 29/66* | (2006.01) |

(Continued)

(52) U.S. Cl.
CPC .. *H01L 29/66545* (2013.01); *H01L 21/32137* (2013.01); *H01L 21/823437* (2013.01); *H01L 21/823828* (2013.01); *H01L 29/165* (2013.01); *H01L 29/401* (2013.01); *H01L 29/495* (2013.01); *H01L 29/4966* (2013.01); *H01L 29/517* (2013.01); *H01L 29/66636* (2013.01); *H01L 29/7848* (2013.01)

(58) Field of Classification Search
CPC ........... H01L 21/28088; H01L 29/4966; H01L 21/823878; H01L 27/092; H01L 21/823842; H01L 29/66545; H01L 29/517
See application file for complete search history.

(56) References Cited

U.S. PATENT DOCUMENTS

| | | | | |
|---|---|---|---|---|
| 6,358,316 B1 * | 3/2002 | Kizuki | ................... | B82Y 10/00 117/105 |
| 9,263,277 B2 * | 2/2016 | Chien | ............... | H01L 21/28088 |

(Continued)

*Primary Examiner* — Mary Wilczewski
*Assistant Examiner* — Tsz Chiu
(74) *Attorney, Agent, or Firm* — Anova Law Group, PLLC

(57) ABSTRACT

The present disclosure provides a transistor device and fabrication method thereof. A dummy gate is formed on a substrate. An interlayer dielectric layer is formed on the substrate and sidewall surfaces of the dummy gate. The interlayer dielectric layer has a top surface coplanar with a top surface of the dummy gate. A mask layer is formed on the top surface of the interlayer dielectric layer. The mask layer is used as an etch mask to remove the dummy gate to form a trench in the interlayer dielectric layer to provide a trench footing on sidewall surfaces of the trench and near a trench bottom. The trench footing is then removed by applying a dry etching process. A gate electrode is then formed in the trench to form a transistor with improved electrical performance.

17 Claims, 7 Drawing Sheets

(51) Int. Cl.
*H01L 29/40* (2006.01)
*H01L 29/51* (2006.01)
*H01L 21/8234* (2006.01)
*H01L 29/78* (2006.01)
*H01L 29/165* (2006.01)
*H01L 21/3213* (2006.01)

(56) References Cited

U.S. PATENT DOCUMENTS

| | | | |
|---|---|---|---|
| 2004/0087045 A1* | 5/2004 | Hecht | H01L 21/02178 438/9 |
| 2013/0260561 A1* | 10/2013 | Ranjan | H01L 21/02112 438/696 |
| 2014/0061811 A1* | 3/2014 | Chien | H01L 21/28088 257/369 |
| 2015/0072530 A1* | 3/2015 | Kim | H01L 21/3065 438/703 |

* cited by examiner

TRANSISTOR DEVICE AND FABRICATION METHOD

CROSS-REFERENCES TO RELATED APPLICATIONS

This application claims the priority of Chinese patent application No. 201410491230.2, filed on Sep. 24, 2014, the entirety of which is incorporated herein by reference.

FIELD OF THE DISCLOSURE

The present disclosure generally relates to the field of semiconductor fabrication technologies and, more particularly, relates to transistor devices and fabrication methods.

BACKGROUND

The mainstream semiconductor devices of integrated circuits, particularly very large scale integrated circuits, are Metal-Oxide-Semiconductor Field-Effect Transistors (MOS transistors). With the constant advancement of integrated circuit fabrication technology, the semiconductor device technology node continues to reduce and the transistor geometrical size continues to shrink following the Moore's law. When the transistor size is reduced to a certain extent, a variety of secondary effects due to the physical limits of the transistors may occur one after another. It becomes increasingly difficult to downscale the transistor feature size (or critical dimension). Among many challenges in transistor and semiconductor device fabrication, the most difficult problem is often the transistor leakage current. The rising of the transistor leakage current is mainly caused by the continuously-shrunk thickness of the conventional gate dielectric layer.

The current approach to overcome the leakage current problem is to use high-k gate dielectric material, instead of using more conventional silicon dioxide gate dielectric material, and to use a metallic material for the gate electrode in order to avoid the Fermi level pinning and the boron osmotic effect when the high-k gate dielectric material and the conventional gate electrode material make a contact. The use of such high-k metal gate (HKMG) reduces transistor leakage current.

Although the high-k metal gate structure reduces transistor leakage current to some extent, the electrical performance of such transistors still needs to be improved due to the uncertainties during conventional formation process of transistors.

SUMMARY

One aspect or embodiment of the present disclosure includes a method for fabricating a transistor, by providing a dummy gate on a substrate. An interlayer dielectric layer is formed on the substrate and sidewall surfaces of the dummy gate. The interlayer dielectric layer has a top surface coplanar with a top surface of the dummy gate. A mask layer is formed on the top surface of the interlayer dielectric layer. The mask layer is used as an etch mask to remove the dummy gate to form a trench in the interlayer dielectric layer to provide a trench footing on sidewall surfaces of the trench and near a trench bottom. The trench footing is then removed by applying a dry etching process.

Another aspect or embodiment of the present disclosure includes a transistor device. The transistor device includes a substrate and a gate structure on the substrate. The gate structure includes a gate dielectric layer on the substrate, and a gate electrode on the gate dielectric layer. The gate electrode is formed by: providing a dummy gate on the gate dielectric layer and forming an interlayer dielectric layer on the substrate and sidewall surfaces of the dummy gate. The dummy gate is removed to form a trench in the interlayer dielectric layer to provide a trench footing on sidewall surfaces of the trench and near a trench bottom. The trench footing is removed by applying a dry etching process to expose the gate dielectric layer. An oxygen vacancy removal treatment is performed at the trench bottom for forming the gate electrode in the trench. The dry etching process uses an etching gas at least including $H_2$ in a synchronized pulse etching process, and the oxygen vacancy removal treatment uses one or more of He, $CF_4$, $NF_3$ and $SF_6$ to remove oxygen vacancies.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
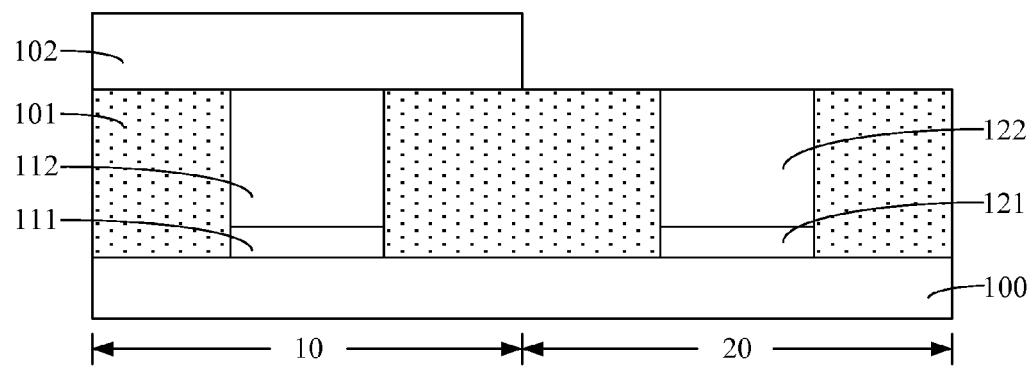
FIGS. 1 and 2 illustrate cross-sectional structure diagrams of a transistor formation process.

FIG. 1 illustrates a fabrication process for a CMOS transistor. As shown in FIG. 1, a substrate 100 is provided. The substrate 100 includes a first region 10 and a second region 20. In the first region 10, a first dummy gate structure is formed on the surface of the substrate 100. The first dummy gate structure includes a first gate dielectric layer 111 and a first dummy gate 112 on the surface of the first gate dielectric layer 111. In the second region 20, a second dummy gate structure is formed on the surface of the substrate 100. The second dummy gate structure includes a second gate dielectric layer 121 and a second dummy gate 122 on the surface of the second gate dielectric layer 121. An interlayer dielectric layer 101 is formed on the surface of the substrate 100, the sidewall surfaces of the first dummy gate structure and the sidewall surfaces of the second dummy gate structure. The top of the interlayer dielectric layer 101 is coplanar with the top of the first dummy gate structure and the top of the second dummy gate structure.

Referring to FIG. 1, a photoresist layer 102 is formed on the top surface of the first dummy gate structure and the surface of the interlayer dielectric layer 101 within the first region 10. The photoresist layer 102 is configured as an etch mask to subsequently etch and remove the second dummy gate 122.

Figure 2:
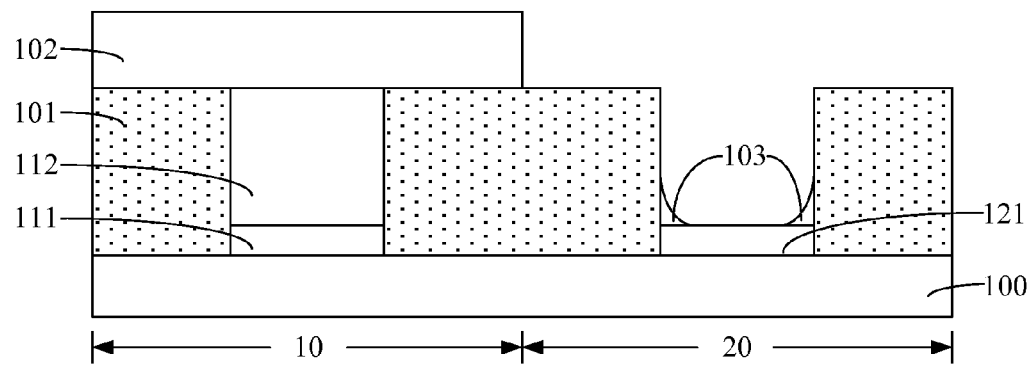

Referring to FIG. 2, the photoresist layer 102 is configured as an etch mask to etch and remove the second dummy gate 122 (as shown in FIG. 1) to form a trench in the interlayer dielectric layer 101 within the second region 20.

The etching gas for the etching process is usually a fluorine-containing gas. During the etching process, the fluorine in the etching gas reacts with the material of the photoresist layer 102 to generate an organic polymer. The organic polymer is deposited on the second dummy gate 122 to be etched along the etching direction. The thicker the second dummy gate 122 is etched, the deeper the trench is formed. The etching gas collides with the interlayer dielectric layer 101 on both sides of the trench and accumulates the momentum to move toward the center region of the trench. The center region refers to a region with respect to sidewalls of the trench within the interlayer dielectric layers 101. As a result, the etching gas is relatively denser in the center region of the trench. This is why the organic polymer on the second dummy gate in the center region is easy to be etched away and the organic polymer in the region closer to the interlayer dielectric layer 101 is difficult to be etched away.

When the second dummy gate 122 in the center region of the trench is etched and removed as the etching continues, a layer of polymer starts to accumulate over the peripheral region of the trench and makes it much harder to remove the second dummy gate 122 in the peripheral region of the trench, causing a trench footing 103 to be formed on the sidewall surfaces near the trench bottom. The trench footing 103 includes the residues of the second dummy gate 122 and the polymer layer (generated by reactions between the etching gas and the photoresist layer 102) covering the remaining second dummy gate 122.

The presence of the trench footing leads to poor performance of the subsequently formed second gate structure, thereby affecting the performance of the formed transistor.

The present disclosure provides a method of forming a transistor, including the etching and removal of the dummy gate and the formation of a trench in the interlayer dielectric layer having a trench footing on the sidewall surfaces near the trench bottom. A dry etching process is used to etch away the trench footing and to improve the quality of the subsequently formed gate structure, thereby enhancing the performance of the formed transistor.

The above and other objects, features and advantages of the present disclosure can be more fully understood from the following description of the specific embodiments considered in connection with the accompanying illustrative drawings.

For example, transistor devices and fabrication methods are provided herein by removing the trench footing after removing the dummy gate but before forming a gate electrode or a metal gate. Quality of the gate electrode and electrical performances of the resultant transistor devices are improved.

FIGS. 3 through 12 and FIG. 14 illustrate the cross-sectional structure diagrams of a transistor formation process according to an exemplary embodiment of the present disclosure.

The transistors to be formed in various embodiments may be an NMOS transistor, a PMOS transistor, or a CMOS transistor, although the CMOS transistor is used as the example for the transistors to be illustrated in the exemplary embodiments.

Figure 3:
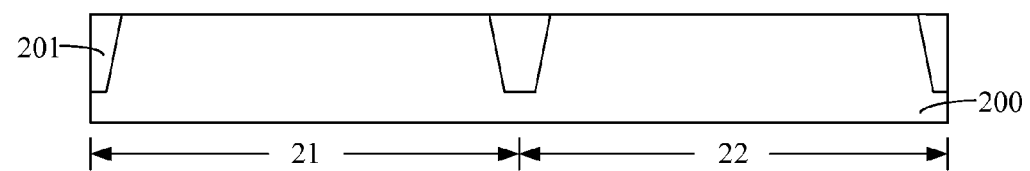
FIGS. 3 through 12 and FIG. 14 illustrate the cross-sectional structure diagrams of a transistor device during a formation process according to an exemplary embodiment of the present disclosure.

Referring to FIG. 3, a substrate 200 is provided. The substrate 200 includes a first region 21 and a second region 22 (e.g., in Step 1503 of FIG. 15).

Specifically, the substrate 200 may be one of monocrystalline silicon, poly-crystalline silicon, amorphous silicon and silicon-on-insulator. The substrate 200 may also be a Si substrate, a Ge substrate, a SiGe substrate or a GaAs substrate. In some cases, one or more epitaxial interface layers and/or strained layers may be formed on the surface of the substrate 200 to improve the electrical performance of a CMOS transistor. In one embodiment of the present disclosure, the substrate 200 is a Si substrate.

The first region 21 may be an NMOS region or a PMOS region. The second region 22 may be an NMOS or a PMOS region. The type of the first region 21 and the type of the second region 22 may be the same or the opposite. In the exemplary embodiments of the present disclosure, the first region 21 and second region 22 are of opposite types. For example, when the first region 21 is an NMOS region, the second region 22 is a PMOS region.

The first region 21 and second region 22 may be adjacent or separated from one another. In an exemplary embodiment, the first region 21 and the second region 22 are adjacent.

An isolation structure 201, for example, a shallow trench isolation (STI) structure, may be formed in the substrate 200. The filling material of the isolation structure 201 may be one or more of silicon oxide, silicon nitride and silicon oxynitride. It should be noted that the formation of the isolation structure 201 is optional and not mandatory. The isolation structure 201 may be used to isolate the first region 21 from the second region 22 to prevent different transistors from being electrically connected. In an exemplary embodiment, a shallow trench isolation structure 201 is formed in the substrate 200. The shallow trench isolation structure 201 is filled with silicon oxide.

In various embodiments, a p-well region may be formed within the first region 21 or the second region 22 in the substrate 200. A small amount of dose of n-type ions may be implanted into the p-well region. The n-type ions may be As, P and/or Sb. An n-well region may be formed within the first region 21 or the second region 22. A small amount of dose of p-type ions may be implanted into the n-well region. The p-type ions may be B, Ga and/or In. The implantation of a small amount of dose of ions is used to improve the threshold voltage of the first region 21 and/or the second region 22 and to provide desirable electrical performance for the formed transistor.

Figure 4:
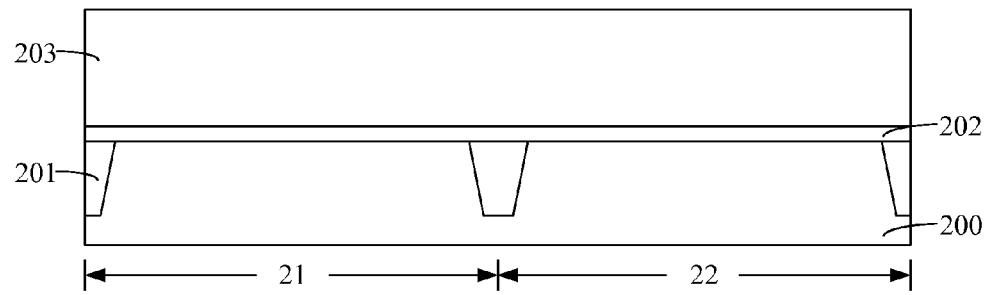
Figure 15:
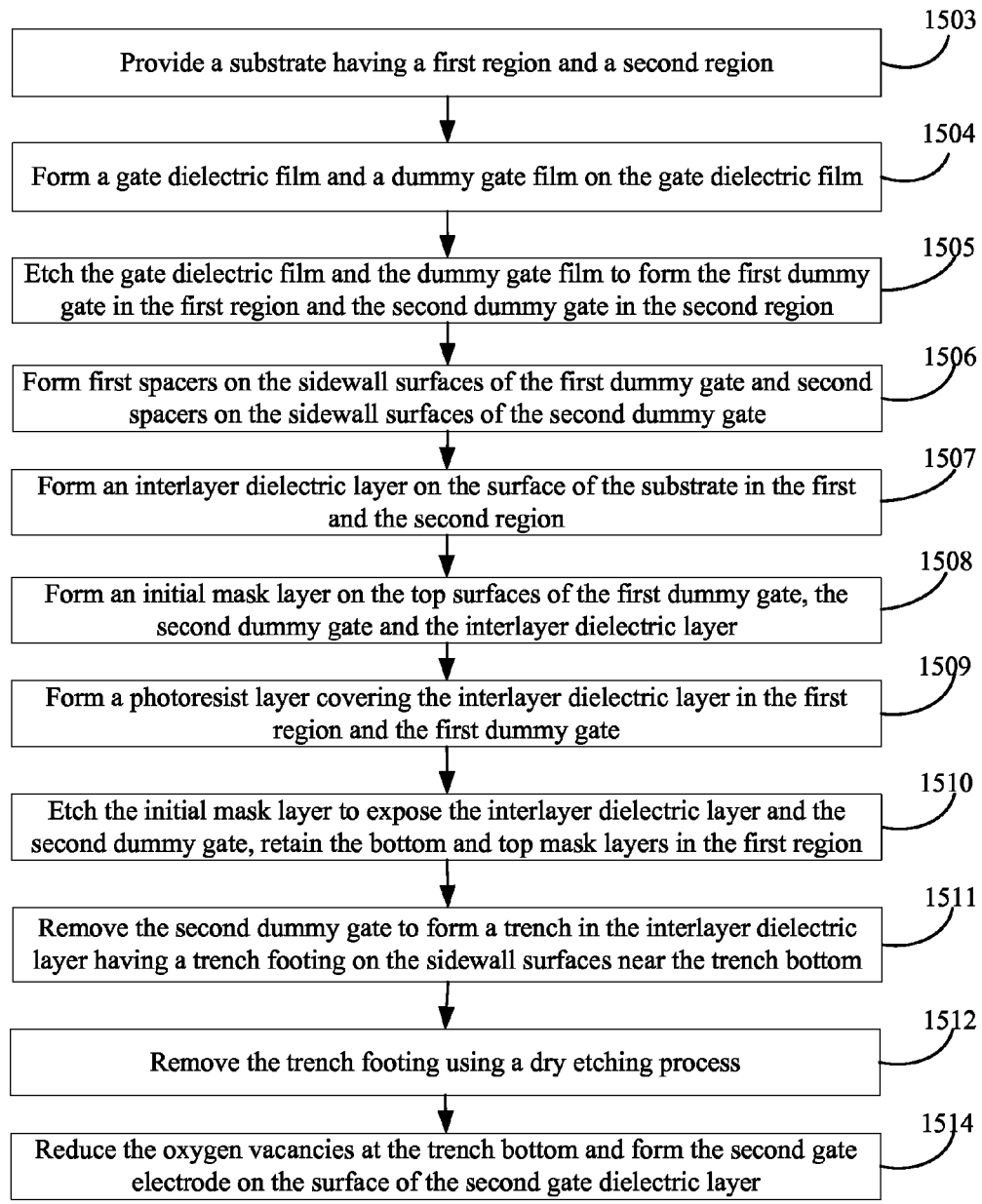
FIG. 15 illustrates an exemplary method for forming a transistor device according to various embodiments of the present disclosure.

Referring to FIG. 4, a gate dielectric film 202 is formed on the surface of the substrate 200 and a dummy gate film 203 is formed on the surface of the gate dielectric film 202 (e.g., in Step 1504 of FIG. 15).

The gate dielectric film 202 is used to subsequently form a first gate dielectric layer and a second gate dielectric layer. The dummy gate film 203 is used to subsequently form a first dummy gate and a second dummy gate.

In one embodiment, a high-k dielectric layer is formed before a metal gate is formed (i.e., high k first metal gate last). As used herein, the high-k dielectric layer is formed by a dielectric material having a relative dielectric constant higher than silicon oxide. A first gate structure and a second gate structure are then formed in a transistor. The second gate dielectric layer is retained after the second dummy gate is removed. The second gate dielectric layer eventually becomes the gate dielectric layer of the second gate structure to be formed. The first gate dielectric layer is retained after the first dummy gate is removed. The second gate dielectric layer eventually becomes the gate dielectric layer of the first gate structure to be formed.

The gate dielectric film 202 may include a single layer structure or a multi-layer structure. Specifically, when the gate dielectric film 202 has a single layer structure, the gate dielectric film 202 is made of a high-k dielectric material, e.g., $HfO_2$, HfSiO, HfSiON, HfTaO, HfTiO, HfZrO, $ZrO_2$, or $Al_2O_3$. When the gate dielectric film 202 has a multi-layer structure, the gate dielectric film includes a high-k dielectric film and a work function film on the surface of the high-k dielectric film. For example, the high-k dielectric film may be made of a high-k dielectric material, and the work function film may be configured to adjust the work function of the second gate structure and made of a dielectric material such as Ti, Ta, TiN and/or TaN.

Before the gate dielectric film 202 is formed, an interfacial film is formed on the surface of the substrate 200. The interfacial film is used to subsequently form the first interfacial layer between the substrate 200 and the first gate dielectric layer, and to form the second interfacial layer between the substrate 200 and the second gate dielectric layer. The material of the interfacial film includes silicon oxide, silicon nitride or silicon oxynitride.

In another embodiment, a high-k dielectric layer is formed after a metal gate is formed (i.e., high k last metal gate last) to form a first gate structure and a second gate structure of a transistor. The second gate dielectric layer is removed after the second dummy gate is removed. The first gate dielectric layer is removed after the first dummy gate is removed. The gate dielectric film 202 may include a single layer structure or a multi-layer structure. The gate dielectric film 202 is made of silicon oxide, silicon nitride or silicon oxynitride.

The present disclosure is described using the "high k first metal gate last" as an example to form the first and the second gate structures, although any suitable fabrication methods (e.g., high k last metal gate last) can be encompassed within the scope of the present disclosure. For example, the gate dielectric film 202 includes a high-k dielectric film and a work function film on the surface of the high-k dielectric film. The high-k dielectric film may be made of hafnium oxide and the work function film may be made of titanium nitride. Also an interfacial film may be formed between the substrate 200 and the high-k dielectric film. The interfacial film may be made of silicon oxide.

In one embodiment, since the second gate dielectric layer is retained after the second dummy gate is etched and removed, a high etching selectivity (or selection ratio) is required for the etching process to etch the dummy gate film 203 and the gate dielectric film 202. For example, the dummy gate film may be made of polysilicon, titanium nitride or amorphous carbon. In one embodiment, the dummy gate film 203 is made of polysilicon.

Figure 5:
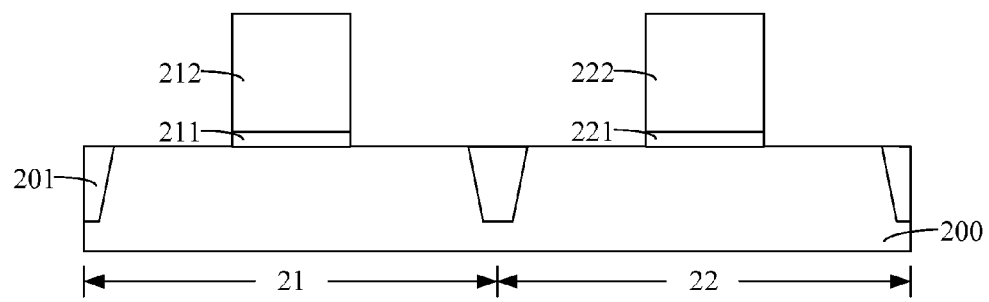

Referring to FIG. 5, a patterned photoresist layer is formed on the surface of the dummy gate film 203 (referring to FIG. 4). By employing the patterned photoresist layer as an etch mask, the dummy gate film 203 and the gate dielectric film 202 (referring to FIG. 4) are etched to form a first dummy gate 212 in the first region 21 of the substrate 200 and a second dummy gate 222 in the second region 22 of the substrate 200 (e.g., in Step 1505 of FIG. 15).

Specifically, the dummy gate film 203 is patterned to form a first dummy gate 212 and a second dummy gate 222. The gate dielectric film 202 is patterned to form a first gate dielectric layer 211 and a second gate dielectric layer 221.

In one embodiment, a first gate dielectric layer 211 is formed between the substrate 200 in the first region 21 and the first dummy gate 212. The first gate dielectric layer 211 eventually becomes the gate dielectric layer of the first gate structure. A second gate dielectric layer 221 is formed between the substrate 200 in the second region 22 and the second dummy gate 222. The second gate dielectric layer 221 eventually becomes the gate dielectric layer of the second gate structure. The first gate dielectric layer 211 may also be used as an etch stop layer when the first dummy gate 212 is subsequently etched and removed. The second gate dielectric layer 221 may also be used as an etch stop layer when the second dummy gate 222 is subsequently etched and removed.

After the first dummy gate 212 and the second dummy gate 222 are formed by patterning, the patterned photoresist layer is removed. In one embodiment, the ashing process is used to remove the patterned photoresist layer. The parameters for the ashing process include: an ashing gas of $O_2$, a flow rate of $O_2$ between about 20 sccm to about 200 sccm, and an ashing temperature between about 300° C. and about 500° C.

Figure 6:
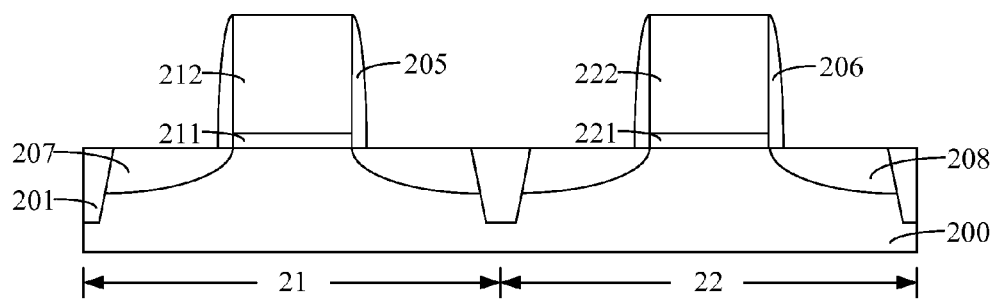

Referring to FIG. 6, first sidewall spacers 205 are formed to cover the sidewall surfaces of the first dummy gate 212. Second sidewall spacers 206 are formed to cover the sidewall surfaces of the second dummy gate 222 (e.g., in Step 1506 of FIG. 15).

In one embodiment, the first sidewall spacers 205 also cover the sidewall surfaces of the first gate dielectric layer 211. The second sidewall spacers 206 also cover the sidewall surfaces of the second gate dielectric layer 221. The first sidewall spacers and the second sidewall spacers 206 are made of silicon oxide, silicon nitride or silicon oxynitride.

In one embodiment, the step of forming first sidewall spacers 205 and second sidewall spacers 206 includes the following. A sidewall spacer film is formed on the surface of the substrate 200 in the first region 21 and the second region 22, the sidewalls of the first gate dielectric layer 211, the sidewalls of the first dummy gate 212, the sidewalls of the second gate dielectric layer 221, and the sidewalls and the top surface of the second dummy gate 222. Using maskless etching process, the sidewall spacer film is etched back. The sidewall spacer film is etched and removed from the top of the first dummy gate 212, the top of the second dummy gate 222, and the surface of the substrate 200. First sidewall spacers 205 are formed on the sidewall surfaces of the first gate dielectric layer 211 and the first dummy gate 212. Second sidewall spacers 206 are formed on the sidewall surfaces of the second gate dielectric layer 221 and the second dummy gate 222.

In one embodiment, the first sidewall spacers 205 and the second sidewall spacers 206 are made of silicon nitride. Before the first sidewall spacers 205 and the second sidewall spacers 206 are formed, a first lightly doped region is formed within the substrate 200 in the first region 21 on both sides of the first dummy gate 212 and a second lightly doped region is formed within the substrate 200 in the second region 22 on both sides of the second dummy gate 222. The first lightly doped region and the second lightly doped region help alleviate the hot carrier effect in the transistor.

Further referring to FIG. 6, a first doped region 207 is formed within the substrate 200 in the first region 21 on both sides of the first dummy gate 212. A second doped region 208 is formed within the substrate 200 in the second region 22 on both sides of the second dummy gate 222.

The first doped region 207 and the second doped region 208 may be doped with either n-type dopant or p-type dopant. The n-type dopant includes ions of P, As or Sb, and the p-type dopant includes ions of B, Ga or In.

When the first region 21 is an NMOS region, the first doped region 207 is doped with n-type dopant. When the first region 21 is a PMOS region, the first doped region 207 is doped with p-type dopant. When the second region 22 is an NMOS region, the second doped region 208 is doped with n-type dopant. When the second region 22 is a PMOS region, the second doped region 208 is doped with p-type dopant.

In one embodiment, in order to improve the carrier mobility of the transistor, a first stress layer is formed in the first doping region 207 and a second stress layer is formed in the second doped region 208.

When the first doped region 207 is doped with n-type dopant, the first stress layer is made of SiC or SiCP. The first stress layer applies a tensile stress to the channel region in the first region 21 to improve the carrier mobility in the first region 21. When the first doped region 207 is doped with p-type dopant, the first stress layer is made of SiGe or SiGeP. The first stress layer applies a compressive stress to the channel region in the first region 21 to improve the carrier mobility in the first region 21.

When the second doped region 208 is doped with n-type dopant, the second stress layer is made of SiC or SiCP. The second stress layer applies a tensile stress to the channel region in the second region 22 to improve the carrier mobility in the second region 22. When the second doped region 208 is doped with p-type dopant, the second stress layer is made of SiGe or SiGeP. The second stress layer applies a compressive stress to the channel region in the second region 22 to improve the carrier mobility in the second region 22.

In one embodiment, the first doped region 207 is doped with n-type dopant. The first stress layer is made of SiC, wherein the atomic percentage of carbon atoms in the SiC layer is between about 0.1% and about 10%. The second doped region 208 is doped with p-type dopant. The second stress layer is made of SiGe, wherein the atomic percentage of germanium atoms in the SiGe layer is between about 10% and about 50%.

In one embodiment, the step of forming a first stress layer includes the following. A mask layer is formed to cover the substrate 200 in the second region 22 and the second dummy gate. By employing the mask layer as an etch mask, a portion of the substrate 200 on both sides of the first dummy gate is etched and removed to form a trench within the substrate 200 in the first region 21. The cross-sectional shape of the trench may be rectangular, U-shaped or sigma-shaped. By employing a selective epitaxy process, a first stress layer is formed to fill up the trench. The surface of the stress layer may be coplanar with or above the surface of the substrate 200 in the first region 21. The first stress layer is made of SiC or SiCP. The mask layer is then removed.

Selective epitaxy process is used to form the first stress layer and the second stress layer.

After the first doped region 207 and the second doped region 208 are formed, the step further includes the following. The first doped region 207 and the second doped region 208 are heat-treated so that the dopant ions in the first doped region 207 and the second doped region 208 are redistributed and activated and the lattice defects in the substrate 200 caused by the process for forming the first doped region 207 and the second doped region 208 are repaired.

Figure 7:
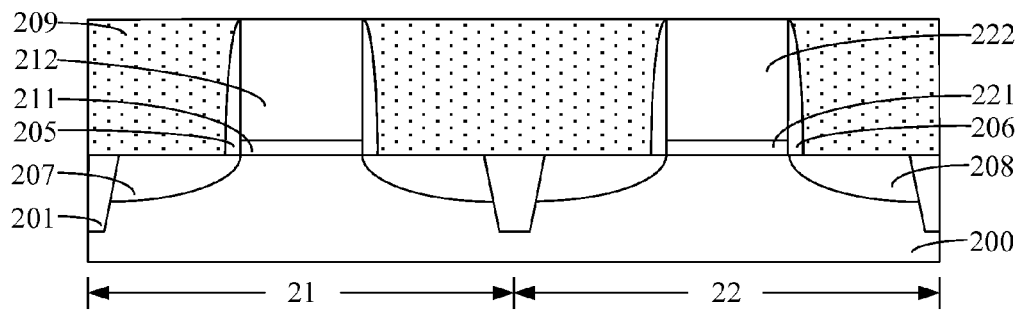

Referring to FIG. 7, an interlayer dielectric layer 209 is formed on the surface of the substrate in the first region 21 and the second region 22. The top of the interlayer dielectric layer 209 is coplanar with the top of the first dummy gate 212 and the top of the second dummy gate 222 (e.g., in Step 1507 of FIG. 15).

In one embodiment, since the first sidewall spacers 205 are formed on the sidewall surfaces of the first dummy gate 212 and the second sidewall spacers 206 are formed on the surface of the second dummy gate 222, the interlayer dielectric layer 209 is also located on the sidewall surfaces of the first sidewall spacers 205 and the second sidewall spacers 206.

The interlayer dielectric layer 209 is made of silicon oxide, silicon oxynitride, or carbon-oxide. In one embodiment, the interlayer dielectric layer 209 is made of silicon oxide.

In one embodiment, the step of forming an interlayer dielectric layer 209 includes the following. An interlayer dielectric film is formed to cover the surface of the substrate 200, the surface of the first dummy gate 212 and the surface of the second dummy gate 222 by employing chemical vapor deposition, atomic layer deposition, or physical vapor deposition process. The top surface of the interlayer dielectric film is above the top surface of the first dummy gate 212. The interlayer dielectric film is polished by chemical mechanical polishing process to form the interlayer dielectric layer 209 until the top surfaces of the first dummy gate 212 and the second dummy gate 222 are exposed.

Before the interlayer dielectric layer 209 is formed, a contact etch stop layer (not shown) is formed on the surface of the substrate in the first region 21 and the second region 22 and on the sidewall surfaces of the first dummy gate 212 and the second dummy gate 222. The contact etch stop layer further covers the sidewall surfaces of the first gate dielectric layer 211 and the second gate dielectric layer 221. When the interlayer dielectric layer 209 is later etched to expose the first doped region 207 and the second doped region 208, the contact etch stop layer is able to stop the etching process to prevent the first doping region 207 and the second doped region 208 from being unnecessarily etched.

Figure 8:
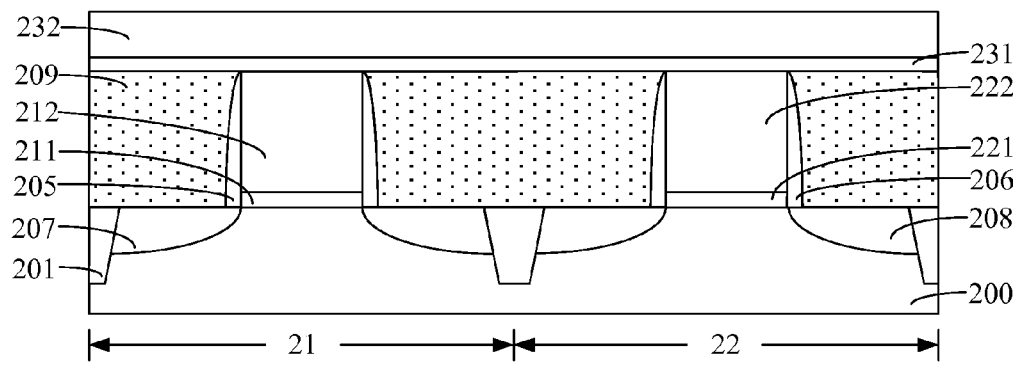

Referring to FIG. 8, an initial mask layer is formed on the top surfaces of the first dummy gate 212 and the second dummy gate 222. The initial mask layer also covers the top surface of the interlayer dielectric layer 209 (e.g., in Step 1508 of FIG. 15).

After the initial mask layer in the second region 22 is etched and removed, the initial mask layer in the first region 21 is retained as a first mask layer.

In one embodiment, the initial mask layer is a multi-layer structure. The initial mask layer includes a bottom initial mask layer 231 on the top surfaces of the interlayer dielectric layer 209, the first dummy gate 212 and the second dummy gate 222 and a top initial mask layer 232 on the surface of the bottom initial mask layer 231.

In one embodiment, the bottom initial mask layer 231 is made of TiN or TaN. The subsequent etching process for etching the second dummy gate 222 has a high etching selectivity (or selection ratio) between the second dummy gate 222 and the bottom initial mask layer 231 to avoid etching of undesired region. The top initial mask layer 232 is made of bottom anti-reflective coating (BARC) material to improve the profile of the subsequently formed photoresist layer. The top initial mask layer 232 may be made of an organic or inorganic anti-reflective material. In one embodiment, the top initial mask layer is made of an organic silicon-rich polymer.

In one embodiment, the initial mask layer includes a single layer structure. The initial mask layer includes only one of the bottom initial mask layer and the top initial mask layer. The initial mask layer is made of TiN, TaN, organic anti-reflective material, or inorganic anti-reflective material.

In another embodiment, the bottom initial mask layer may also include a multi-layer structure, including a screen oxide layer and a metal layer on the surface of the screen oxide layer, wherein the screen oxide layer is made of silicon oxide and the metal layer is made of TiN or TaN. The screen oxide layer has the following benefits. Although the subsequent etching process has a high etching selectivity with respect to the interlayer dielectric layer 209, the etching process will still cause some etching damages to the interlayer dielectric layer 209. The screen oxide layer is able to compensate the etching damages to the interlayer dielectric layer 209 and to eliminate the adverse effects caused by etching the interlayer dielectric layer 209.

Figure 9:
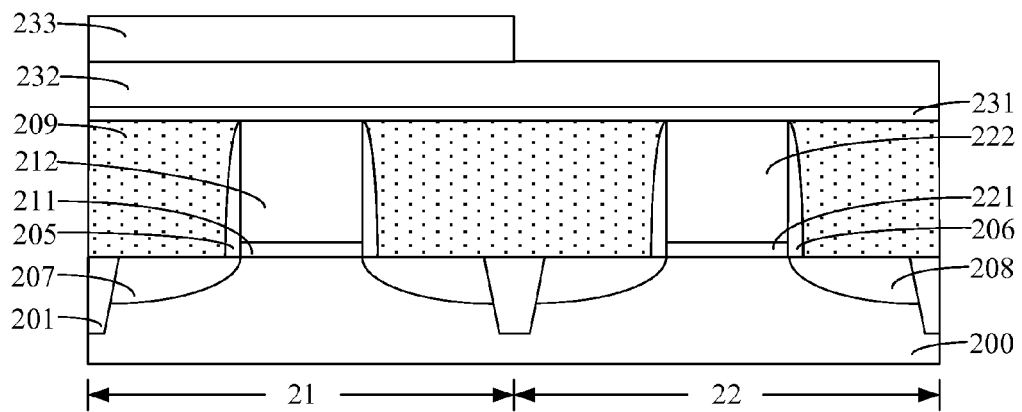

Referring to FIG. 9, a photoresist layer 233 is formed to cover the interlayer dielectric layer 209 in the first region 21 and the first dummy gate 212 (e.g., in Step 1509 of FIG. 15).

The photoresist layer 233 is used as an etch mask to etch and remove the initial mask layer in the second region 22. The photoresist layer 233 also becomes the second mask layer of the mask layer used to etch and remove the second dummy gate 222 later.

In one embodiment, the photoresist layer 233 is located on the surface of the initial mask layer in the first region 21.

In one embodiment, the step of forming the photoresist layer 233 includes the following. A photoresist film is formed on the surface of the initial mask layer. The photoresist film is exposed to light and developed to remove the photoresist film on the surface of the initial mask layer in the second region 22. The photoresist layer 233 is formed on the surface of the initial mask layer in the first region 21.

In one embodiment, since the top initial mask layer 232 is made of a bottom anti-reflective coating material, the unnecessary reflection and refraction of light during the exposure processing are reduced, which improves the accuracy of the photoresist layer 233 formed.

In another embodiment, when an initial mask layer is not formed before a photoresist layer is formed, a photoresist layer is formed directly on the top surface of the interlayer dielectric layer 209 in the first region 21 and the top surface of the first dummy gate 212.

Figure 10:
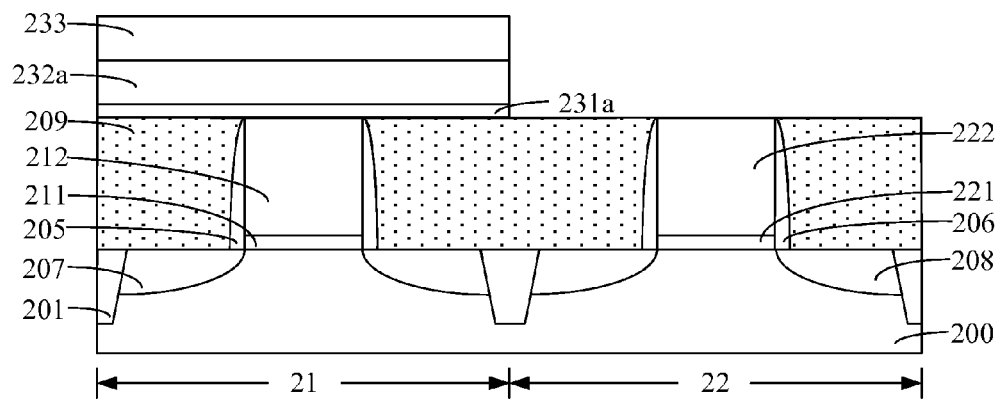

Referring to FIG. 10, the photoresist layer 233 is used as an etch mask to etch and remove the initial mask layer in the second region 22 to expose the surface of the interlayer dielectric layer 209 in the second region 22 and the top surface of the second dummy gate 222. The bottom initial mask layer 231a and the top initial mask layer 232a in the first region 21 are retained (e.g., in Step 1510 of FIG. 15).

Specifically, a dry etching process is used to etch away the top initial mask layer 232 in the second region 22 (referring to FIG. 9). Then the dry etching process is used to etch away the bottom initial mask layer 231 in the second region 22 (referring to FIG. 9). In one embodiment, the etching gas used in the dry etching process includes $Cl_2$.

The remaining bottom initial mask layer 231a and the remaining top initial mask layer 232a become the first mask layer of the mask layer used to etch and remove the second dummy gate mask 222.

Specifically, in one embodiment, a mask layer is formed on the top surface of the first dummy gate 212 and on the surface of the interlayer dielectric layer 209 in the first region 21. The mask layer is used as an etch mask to etch and remove the second dummy gate 222 to expose the top surface of the second dummy gate 222. The mask layer includes a multi-layer structure. The mask layer includes a first mask layer on the top surface of the first dummy gate 212 and on the surface of the interlayer dielectric layer 209 in the first region 21 and a second mask layer on the surface of the first mask layer, wherein the first mask layer includes a multi-layer structure. The first mask layer includes the remaining bottom mask layer 231a and the remaining top mask layer 232a on the surface of the bottom mask layer 231a. The remaining bottom mask layer 231a is made of a metal material. The remaining top mask layer 232a is made of a bottom anti-reflective coating material. The second mask layer is a photoresist layer 233. In another embodiment, the first mask layer includes a single layer structure. The first mask layer is made of a metallic material or a bottom anti-reflective coating material.

In one embodiment, the mask layer includes a multi-layer structure, wherein the remaining top mask layer 232a improves the formation accuracy of the photoresist layer 233. The remaining bottom mask layer 231a helps raise the etching selectivity for the subsequent etching process. Compared with the etching selectivity between the photoresist layer 233 and the second dummy gate 222, the etching selectivity between the remaining bottom mask layer 231a and the second dummy gate 222 is higher. Hence, even if a portion of the photoresist layer 233 is etched and removed in the subsequent etching process, the bottom mask layer 231a still provides adequate masking effect to avoid any unnecessary etching.

In another embodiment, a mask layer is formed on the top surface of the first dummy gate structure 222 and on the surface of the interlayer dielectric layer 209. The mask layer is used as an etch mask to etch and remove the second dummy gate 222. The mask layer includes a single layer structure, e.g., a photoresist layer.

Figure 11:
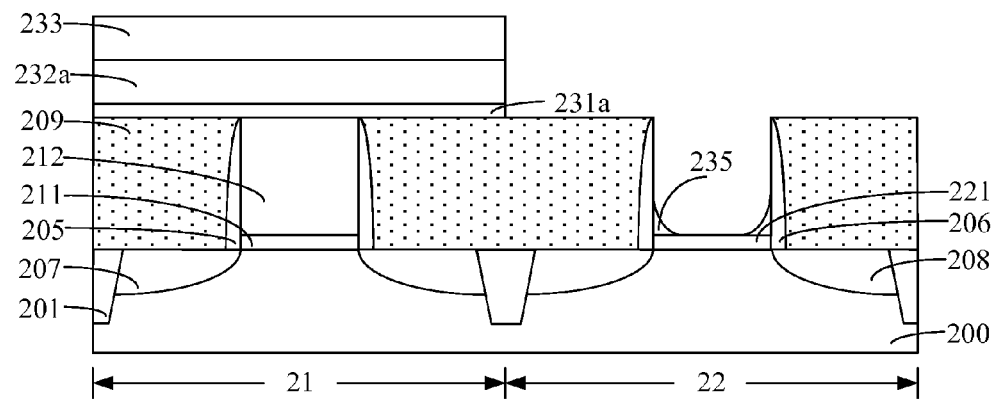

Referring to FIG. 11, the mask layer is used as an etch mask to etch and remove the second dummy gate 222 to form a trench in the interlayer dielectric layer 209 in the second region 22, wherein a trench footing is formed on the sidewall surfaces near the trench bottom (e.g., in Step 1511 of FIG. 15).

In one embodiment, a synchronous pulse etching process is used to etch and remove the second dummy gate 222. The synchronous pulse etching process provides a first source power and a first bias power, wherein the first source power and the first bias power are both in pulse mode.

In the synchronous pulse etching process, a first source power has a high level and a low level segment. The high and low segments change alternately. A first bias power has high frequency and low frequency segments. The high frequency and low frequency segments change alternately. When the first source power is at a high level segment, the etching gas is ionized by the first source power to form a plasma. The plasma formed during the high level source power segment has high energy. When the first source power is at the low level segment, the etching gas is ionized by the first source power to form a sparse plasma. The plasma formed during the low level source power segment has low energy.

When the first bias power is at a high level segment, the plasma advancing direction is almost perpendicular to the surface of the substrate 200, etching down along the top surface of the second dummy gate 222. The resultant etching process is an anisotropic etching process. When the first bias power is at a low level segment, the plasma advancing direction has no focus. The resultant etching process is an isotropic etching process.

Using the synchronous pulse etching process to remove the second dummy gate 222 has the following benefits. In one aspect, depending on the pattern density, the substrate 200 can be divided into isolated pattern region and dense pattern region. When the synchronous pulse etching process is used to etch the second dummy gate 222, the etching thickness variation caused by the uneven pattern density is reduced. In other words, the etching thickness remains consistent across the second dummy gate 222 with different pattern density. In another aspect, when the synchronous pulse etching process is used to etch the second dummy gate 222, the etching selectivity between the second dummy gate 222 and the mask layer is increased. Further, when the synchronous pulse etching process is used to etch the second dummy gate 222, the damages to the substrate 200 caused by the plasma etching process is minimized. Hence the quality of the transistor channel region is improved.

In one embodiment, the pulse mode of the first source power and the first bias power has the same frequency and the same phase. When the first source power is at a high level segment, the first bias power is also at a high level segment. When the first source power is at a low level segment, the first bias power is also at a low level segment. The etching gases used in the synchronous pulse etching process include, for example, HBr, fluorine-containing gas, and/or $Cl_2$. The fluorine-containing gas may be $CF_4$ or $CHF_3$.

In one embodiment, the first source power has a high power level between about 1,000 watts and about 2,500 watts. The first source power has a low power level between about 500 watts and about 1,500 watts, or about 500 watts and about 1,000 watts. The first source power has a duty cycle between about 10% and about 80%. The first bias power has a high power level between about 250 watts and about 500 watts. The first bias power has a low power level between about 0 watts and about 200 watts. The first bias power has a duty cycle between about 10% and about 80%. The duty cycle refers to the ratio of the high level segment over one pulse period.

In order to further reduce the etching rate of the synchronization pulse etching process to the interlayer dielectric layer 209, the etching selectivity between the interlayer dielectric layer 209 and the second dummy gate 222 needs to be increased. The etching gases used in the synchronous pulse etching process may further include $O_2$, to reduce the etching rate of the synchronization pulse etching process to the interlayer dielectric layer 209.

In one embodiment, the etching chamber pressure is between about 10 mTorr and about 200 mTorr. The etching gases include HBr and $O_2$. The etching gases further include Ar. HBr has a flow rate between about 50 sccm and about 500 sccm. $O_2$ has a flow rate between about 5 sccm and about 100 sccm. Ar has a flow rate between about 50 sccm and about 500 sccm. The etching time duration is between about 10 second and about 600 seconds. The pulse cycle period of the first source power and the first bias power is between about 1,000 and about 10,000.

Despite the above benefits due to the use of synchronous pulse etching process when the second dummy gate 222 is etched and removed, the synchronous pulse etching process may still generate some etching damages to the photoresist layer 233 or the top mask layer 232a. Polymers may be formed from a reaction between the etching gases used in the synchronous pulse etching process (e.g., HBr, fluorine-containing gas and/or $Cl_2$) and the photoresist layer (and/or the bottom anti-reflective coating). In the asynchronous pulse etching process, some part of a layer of the polymers is taken out of the etching chamber and some other part of the layer of the polymers falls on the surface of the second dummy gate 222 waiting to be etched. In the synchronous pulse etching process, due to the blocking effect of the trench sidewalls, the etching rate at the center region of the trench is greater than the etching rate at the peripheral region of the trench. Hence when the polymer in the center region of the trench is etched away, the polymer in the peripheral region of the trench is not completely removed. As the etching process progresses, more and more polymers accumulate in the peripheral region of the trench.

As a result, when the second gate dielectric layer 212 is exposed in the center region of the trench, the residues of the second dummy gate 222 in the peripheral region of the trench are not completely removed. The residues of the second dummy gate 222 are covered by a layer of polymers. In other words, the trench footing 235 may be formed on the sidewall surfaces near the trench bottom as shown in FIG. 11. The trench footing 235 includes residues of the second dummy gate 222 and a layer of polymers covering the surface of the remaining second dummy gate 222.

Figure 12:
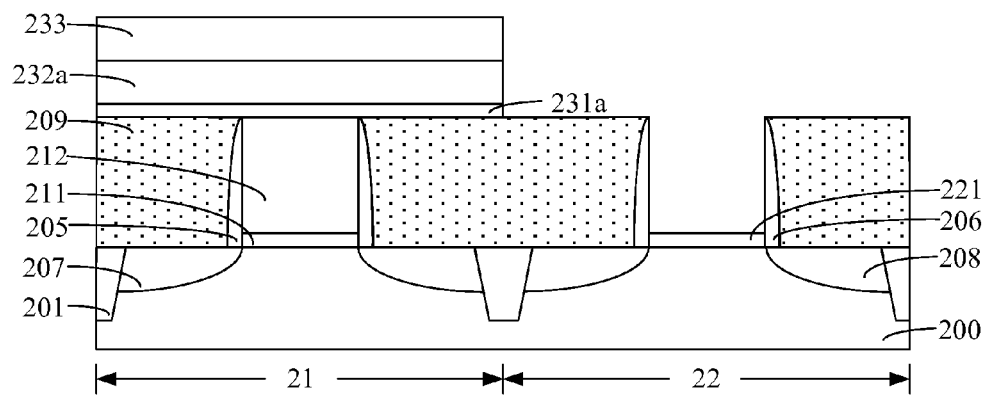

Referring to FIG. 12, a dry etching process is used to etch and remove the trench footing 235 (as shown in FIG. 11) (e.g., in Step 1512 of FIG. 15).

The trench footing 235 is formed on the sidewall surfaces near the trench bottom. The presence of the trench footing affects the performance of the second gate structure to be later formed. In one embodiment, before a second gate structure is formed, a dry etching process is employed to etch and remove the trench footing 235 in order to improve the quality of the subsequently formed second gate structure.

The trench footing 235 includes residues of the second dummy gate 222 and a layer of polymers covering the surface of the remaining second dummy gate 222. Thus the etching gases used in the dry etching process are required to have a high etching rate for both the polymers and the residues of the second dummy gate. In the meantime, since the second gate dielectric layer 221 is exposed at the bottom of the trench, the etching gases used in the dry etching process are required to have a very low etching rate for the second dielectric layer 221 to avoid the etching damages to the second gate dielectric layer 221.

In one embodiment, the etching gases used in the dry etching process includes $H_2$. $H_2$ has a high etching rate for the polymer layer and the remaining second dummy gate but a low etching rate for the second gate dielectric layer 221.

In one embodiment, the dry etching process is a synchronous pulse etching process. The synchronous pulse etching process provides a second source power and a second bias power. Both the second source power and the second bias power are in a pulse mode.

The second source power is used to ionize the etching gases into plasma. The higher power level the second source power is, the denser and the higher energy level the ionized plasma has. The second bias power is used to adjust the plasma advancing direction and speed. The higher power level the second bias power is, the closer to the 90 degrees for the angle between the advancing direction and the substrate surface becomes and the faster the plasma advancing speed is. In other words, when the second source power and the second bias power are at a high level segment, the dry etching process becomes a strong anisotropic etching process. When the second source power and the second bias power are at a low level segment, the dry etching process becomes an isotropic etching process having a slow etching rate.

By alternating between the anisotropic etching and the isotropic etching process, the trench footing 235 is etched and removed while the etching damages to the second gate dielectric layer 221 is reduced. Hence the high quality of the second gate dielectric layer 221 is maintained.

Meanwhile, when the synchronous pulse etching process is used to etch and remove the trench footing 235, the synchronous pulse etching process provides a slow etching rate for the first mask layer, results in a high etching selectivity between the trench footing 235 and the first mask layer, reduces the etching damages to the first mask layer, and avoids etching to undesired regions. Further, when the synchronous pulse etching process is used to etch and remove the trench footing 235, the plasma bombardment damages to the substrate 200 beneath the second gate dielectric layer 221 is reduced. Hence the channel region in the second region 22 has a high quality.

In one embodiment, in addition to using $H_2$, the etching gases used in the dry etching process to remove the trench footing 235 also include Ar. Ar is able to reduce the plasma electron temperature (Te) in the dry etching process and to further reduce the plasma bombardment damages to the substrate 200 underneath the second gate dielectric layer 221. Hence the quality of the transistor formed is improved.

Figure 13:
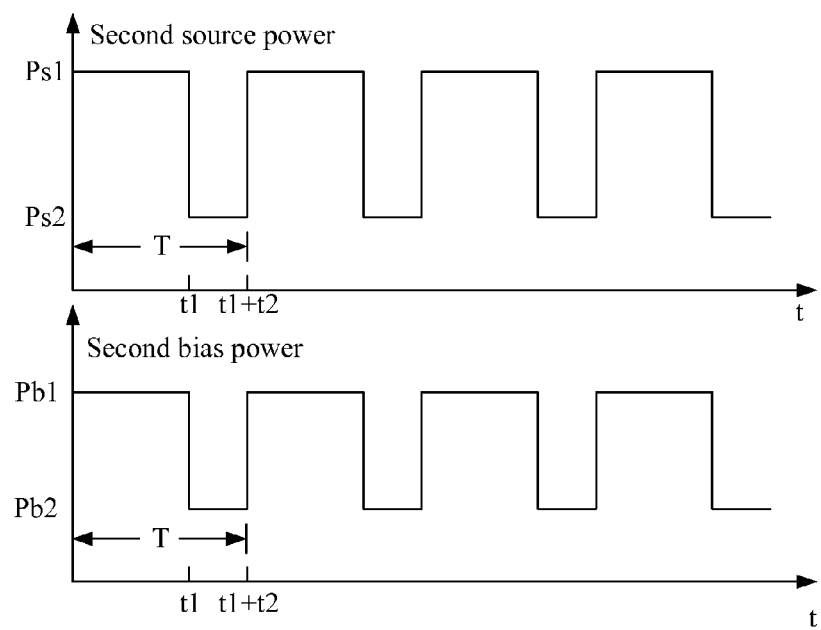
FIG. 13 is a schematic diagram illustrating a pulse mode for a source power and a bias power used in an etching process according to various embodiments of the present disclosure.

In one embodiment, the pulse mode of the second source power and the second bias power has the same frequency and the same phase. FIG. 13 is a schematic diagram illustrating how the second source power and the second bias power change over time. When the second source power is at a high level segment, the second bias power is also at a high level segment. When the second source power is at a low level segment, the second bias power is also at a low level segment. The pulse mode of the second source power and the second bias power is a rectangular pulse wave. The second source power is at a high power level Ps1 for a high level segment length t1 in a pulse period T. The second source power is at a low power level Ps2 for a low level segment t2 in a pulse period T. T=t1+t2. The duty cycle ratio of the first source power is t1/T. The second bias power is at a high power level Pb1 for a high level segment t1 in a pulse period T. The second bias power is at a low power level Pb2 for a low level segment t2 in a pulse period T, T=t1+t2.

When the high power level Ps1 of the second source power is too high, excessive amount of plasma with excessively high energy is generated to cause over etching to the second gate dielectric layer 221. When the high power level Ps1 of the second source power is too low, the amount of the generated plasma is too small and the plasma energy is too low. The etching rate of the dry etching process to etch the trench footing 235 is too slow. When the high power level Pb1 of the second bias power is too high, the plasma advancing speed in a direction perpendicular to the surface of the substrate 200 is too fast, causing too fast etching rate of the dry etching process on the second gate dielectric layer 221. When the low power level Pb2 of the second bias power is too low, the plasma advancing direction becomes unfocused. The amount of plasma generated in the advance direction perpendicular to the surface of the substrate 200 is too small. The plasma advancing speed in the direction perpendicular to the surface of the substrate 200 is too slow. And the etching rate of the dry etching process to etch and remove the trench footing 235 is too slow.

When duty cycle ratio of the second source power and the second bias power is too small, the second source power and the second bias power stay at the high power level segment in a pulse period for too short. The trench footing is etched for a limited time in a pulse period, which prolongs the dry etching process. When the duty cycle ratio of the second source power source and the second bias power is too large, the second source power and the second bias power stay at the high power level segment in a second pulse period for too long and the etching time spent in etching the surface of the second gate dielectric layer 221 in a pulse period is too long. And the second gate dielectric layer 221 may be unnecessarily etched.

In one embodiment, taking all the above aspects into considerations, the second source power has a high power level between about 1,000 watts and about 2,500 watts and a low power level between about 500 watts and about 1,500 watts or between about 500 watts and about 1,000 watts. The duty cycle ratio of the second source power is between about 10% and about 80%. The second bias power has a high power level between about 250 watts and about 500 watts and a low power level between about 0 watts and about 200 watts. The duty cycle ratio of the second bias power is between about 10% and about 80%.

When the $H_2$ flow rate is too low, the amount of plasma generated is too small. The etching rate of the dry etching process to etch the trench footing 235 is too slow. The etching time of the dry etching process is too long. When the $H_2$ flow rate is too high, the amount of plasma generated is too excessive. The etching rate of the dry etching process to etch the trench footing 235 is too fast. The second gate dielectric layer 221 is likely etched unnecessarily. When the Ar flow rate is too slow, Ar is unable to reduce the plasma electron temperature (Te). The plasma has a high electron temperature, resulting in severe plasma bombardment damages to the second gate dielectric layer 221 and the substrate 200 underneath the second gate dielectric layer 221. When the Ar flow rate is too high, the plasma electron temperature is too low. The etching rate of the dry etching process to etch the trench footing 235 is too slow.

In one embodiment, taking all the above analysis into considerations, the second source power has an etching chamber pressure between about 10 mTorr and about 200 mTorr. The $H_2$ flow rate is between about 10 sccm and about 500 sccm. The Ar flow rate is between about 50 sccm and about 500 sccm. The etching time duration is between about 10 seconds and about 600 seconds. The second bias power has a pulse period between about 1,000 and about 10,000.

Figure 14:
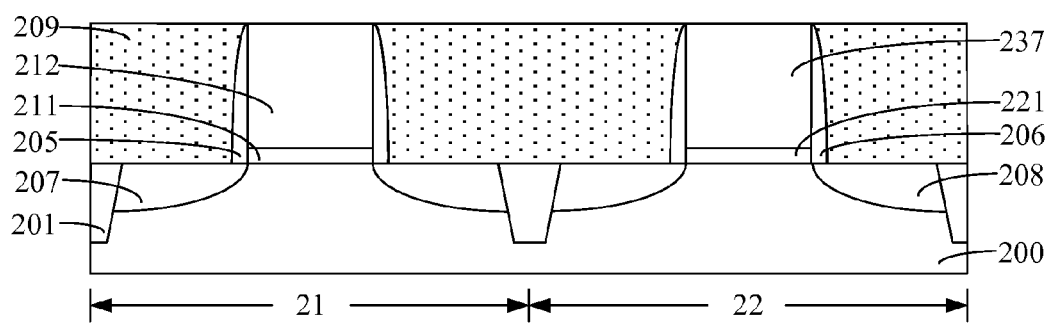

Referring to FIG. 14, an oxygen vacancy removal treatment is applied to the trench bottom to reduce oxygen vacancies at the trench bottom of the substrate 200 or the second gate dielectric layer 221. After the oxygen vacancies removal treatment is completed, a second gate electrode 237 is formed on the surface of the second gate dielectric layer 221. The second gate electrode 237 fills up the trench (e.g., in Step 1514 of FIG. 15).

Since the second gate dielectric layer 221 is formed before (and also experienced) the formation of the first doped region 207 and the second doped region 208, the etching removal of the second dummy gate 222, and the etching removal of the trench footing 235, the second gate dielectric layer 221 may have lattice defects. For example, the amount of oxygen vacancies in the second gate dielectric layer 221 may be increased to form more oxygen vacancy defects. The oxygen vacancy defects in the second gate dielectric layer 221 may raise the threshold voltage (Vt) of the transistor, which is detrimental to the electrical performance of the transistor.

In one embodiment, before the second gate electrode is formed, an oxygen vacancy removal treatment is applied to the second gate dielectric layer 221 to reduce the oxygen vacancy defects in the second gate dielectric layer 221, to lower the threshold voltage of the transistor, and to improve the electrical performance of the transistor.

Specifically, the mechanism of the oxygen vacancies removal treatment includes the following. A working gas is provided in the oxygen vacancy removal treatment. The working gas is ionized to form plasma. The plasma is employed to bombard the second gate dielectric layer 221 to transfer the energy of the plasma to the oxygen vacancies so that the oxygen vacancies acquire substantial kinetic energy. The oxygen vacancies with substantial kinetic energy diffuse to the top surface of the second gate dielectric layer 221 so that the oxygen vacancies in the second gate dielectric layer 221 are reduced and the threshold voltage of the transistor is reduced as well.

In one embodiment, the oxygen vacancy removal treatment provides a working gas including one or more of He, $CF_4$, $NF_3$ and $SF_6$. In some cases, the working gas may also include $N_2$.

In one embodiment, the oxygen vacancy removal treatment includes the plasma bombardment to the second gate dielectric layer 221. In order to reduce the adverse effects of the oxygen vacancy removal treatment on the second gate dielectric layer 221, the source power that ionizes the working gas to form plasma is operated in a pulse mode, wherein the source power has high level segments and low level segments and alternates between high level segments and low level segments. In one embodiment, the pulse mode of the source power is a rectangular pulse wave.

After the oxygen vacancy removal treatment is completed, the mask layer is removed. Specifically, the second mask layer, i.e., a photoresist layer 233 (referring to FIG. 12) is removed. The first mask layer, i.e., the remaining bottom mask layer 231a (referring to FIG. 12) and the remaining top mask layer 232a on the surface of the remaining bottom mask layer 231a (referring to FIG. 12) is then removed.

The second gate electrode 237 and the second gate dielectric layer 221 constitute a second gate structure of the transistor which eventually becomes the gate structure formed in the second region 22.

The second gate electrode 237 is made of one or more of Al, Cu, Ag, Au, Pt, Ni, Ti, Ta, TaC, W, WN, WSi, TiN, TaN, TaSiN, TiSiN, TaAlN, and TiAlN.

In one embodiment, high k first metal gate last method is used to form a second gate structure. The second gate electrode may include a single layer structure or a multi-layer structure. When the second gate electrode 237 has a single layer structure, the second gate electrode 237 includes a metallic layer on the surface of the second gate dielectric layer 221. When the second gate electrode 237 has a multi-layer structure, the second gate electrode 237 includes a work function layer on the surface of the second gate dielectric layer 221 and a metallic layer on the surface of the work function layer.

The material of the work function layer includes Ti or Ta metal nitride, metal silicon nitride, or aluminum nitride, such as TiN, TaN, TaSiN, TiSiN, TaAlN or TiAlN. The material of the metallic layer includes Al, Cu, Ag, Au, Pt, Ni, Ti, TiN, TaN, Ta, TaC, TaSiN, W, WN or WSi.

In one embodiment, the second gate dielectric layer 221 and the second gate electrode 237 on the surface of the second gate dielectric layer 221 constitute the second gate structure of the transistor. The second gate structure eventually becomes the device gate structure formed in the second region 22.

In one embodiment, before the second gate electrode 237 is formed, the trench footing on the sidewall surfaces of the second gate dielectric layer 221 is removed to improve the profile of the subsequently-formed second gate electrode 237 so that the second gate structure formed provides desirable performance to improve the quality of the transistor formed.

Further, the first dummy gate is removed to form the trench in the interlayer dielectric layer in the first region. The trench footing is present on the sidewall surfaces near the trench bottom in the first region. A dry etching process is employed to remove the trench footing. The first gate electrode is formed on the surface of the first gate dielectric layer. The process of removing the first dummy gate and forming the first gate electrode is the same as or similar to the process of removing the second dummy gate and forming the second gate electrode.

Compared with conventional methods and devices, the present disclosure provides the following benefits. The present disclosure provides a method for fabricating a transistor. An interlayer dielectric layer is formed on the surface of the mask layer to expose the top surface of the dummy gate. The mask layer is used as an etching mask to etch and remove the dummy gate to form a trench in the interlayer dielectric layer. During the etching process, the etching gas also etches the mask layer to certain extend. The etching gas reacts with the material of the mask layer to form a polymer. Some polymer is taken out of the etching chamber while some other polymer falls onto the surface of the dummy gate. When the dummy gate is etched and removed, a deep trench is formed in the interlayer dielectric layer. The etching gas collides with the sidewall surfaces of the trench and acquires the momentum to move toward the center region of the trench. As compared with the peripheral region of the trench, the center region of the trench has relatively high etching rate. When the polymer in the center region of the trench is etched away, the polymer in the peripheral region of the trench is not completely removed. As the etching process progresses, after the dummy gate in the center region of the trench is completely etched away, a trench footing is formed in the peripheral region of the trench. The trench footing includes the remaining dummy gate and a polymer layer covering the surface of the remaining dummy gate. A dry etching process is used to remove the trench footing such that the sidewall surfaces of the trench are exactly perpendicular to the substrate surface. The gate electrode subsequently formed in the trench has desirable profile, which improves the electrical performance of the transistor formed.

Further, the etching gases used in the dry etching process include $H_2$. $H_2$ has a high etching rate for the trench footing but a low etching rate for the substrate and the gate dielectric layer at the trench bottom. When the trench footing is etched away, unnecessary etching to the substrate and the gate dielectric layer at the trench bottom is avoided.

Further, the etching gases used in the dry etching process includes Ar. Ar is used to lower the plasma electron temperature and to reduce the plasma bombardment damages to the substrate and the gate dielectric layer at the trench bottom so that the substrate and the gate dielectric layer at the trench bottom maintain a high performance and further enhance the electrical performance of the transistor.

Further, the dry etching process is a synchronous pulse etching process. The synchronous pulse etching process provides a second source power and a second bias power. Both the second source power and the second bias power are in pulse mode. When the synchronous pulse etching process is employed, the dry etching process provides a high etching selectivity between the mask layer and the trench footing to avoid unnecessary etching of the mask layer by the dry etching process. When the synchronous pulse etching process is used to remove the trench footing, the dry etch process causes minimum etching damages to the substrate and the gate dielectric layer at the trench bottom, which improves the electrical performance of the transistor.

Further, the second source power has a high power level between about 1,000 watts and about 2,500 watts and a low power level between about 500 watts and about 1,500 watts or between about 500 watts and about 1,000 watts. The duty cycle of the second source power is between about 10% and about 80%. The second bias power has a high power level between about 250 watts and about 500 watts and a low power level between about 0 watts and about 200 watts. The duty cycle of the second bias power is between about 10% and about 80%. The synchronous pulse etching process has a high etching rate for the trench footing but a low etching rate for the substrate and the gate dielectric layer at the trench bottom. When the trench footing is removed, the etching damages to the substrate and the gate dielectric layer at the trench bottom is avoided.

Further, after the trench footing is removed, an oxygen vacancy removal treatment is applied to the trench bottom to reduce the oxygen vacancy defects in the substrate and the gate dielectric layer at the trench bottom, to reduce the threshold voltage of the transistor, and to improve the electrical performance of the transistor.

Although the present disclosure has been described with exemplary embodiments, the present disclosure is not limited to the foregoing embodiments. Anyone skilled in the art may make various changes or modifications without departing from the spirit and scope of the present disclosure. Therefore the scope of the present disclosure should be defined by the appended claims.

What is claimed is:

1. A method for fabricating a transistor comprising:
    providing a dummy gate on a substrate;
    forming an interlayer dielectric layer on the substrate and sidewall surfaces of the dummy gate, wherein the interlayer dielectric layer has a top surface coplanar with a top surface of the dummy gate;
    forming a mask layer on the top surface of the interlayer dielectric layer;
    using the mask layer as an etch mask to remove the dummy gate to form a trench in the interlayer dielectric layer to provide a trench footing on sidewall surfaces of the trench and near a trench bottom; and
    removing the trench footing by applying a dry etching process;
    wherein the dry etching process is a synchronized pulse etching process using a source power and a bias power, and the source power and the bias power in a pulse mode have a same frequency and a same phase.

2. The method of claim 1, wherein the dry etching process uses an etching gas including $H_2$.

3. The method of claim 2, wherein the etching gas used in the dry etching process further includes Ar.

4. The method of claim 3, wherein the synchronized pulse etching process parameters include:
    a high level of the source power between about 1,000 watts and about 2,500 watts,
    a low level of the source power between about 500 watts and about 1,500 watts,
    a duty cycle of the source power between about 10% and about 80%,
    a high level of the bias power between about 250 watts and about 500 watts,
    a low level of the bias power between about 0 watts and about 200 watts,
    a duty cycle of the bias power between about 10% and about 80%,
    an etching chamber pressure between about 10 milliTorr and about 200 milliTorr,
    a flow rate of $H_2$ between about 10 sccm and about 500 sccm, and
    a flow rate of Ar between about 50 sccm and about 500 sccm.

5. The method of claim 1, wherein the trench footing comprises residues of the dummy gate and a polymer layer covering the residues of the dummy gate.

6. The method of claim 1, wherein the synchronous pulse etching process is applied to remove the dummy gate.

7. The method of claim 6, wherein the synchronized pulse etching process parameters used to remove the dummy gate include:
    a high level of the first source power between about 1,000 watts and about 2,500 watts,
    a low level of the first source power between about 500 watts and about 1,500 watts,
    a duty cycle of the first source power between about 10% and about 80%,
    a high level of the first bias power between about 250 watts and about 500 watts,
    a low level of the first bias power between about 0 watts and about 200 watts,
    a duty cycle of the first bias power between about 10% and about 80%,
    an etching chamber pressure between about 10 milliTorr and about 200 milliTorr, and
    an etching gas comprising HBr, $O_2$ and Ar, with a flow rate of HBr between about 50 sccm and about 500 sccm, a flow rate of $O_2$ between about 5 sccm and about 100 sccm, and a flow rate of Ar between about 50 sccm and about 500 sccm.

8. The method of claim 1, wherein the mask layer includes a single layer structure including a photoresist layer, or includes a multi-layer structure including a first mask layer and a second mask layer on the first mask layer, wherein the second mask layer is a photoresist layer.

9. The method of claim 8, wherein the first mask includes is a single layer structure including a metal or a bottom anti-reflective coating (BARC) layer, or includes a multi-layer structure including a bottom mask layer and a top mask layer on the bottom mask layer, wherein the bottom mask layer is made of a metallic material and the top mask layer is made of a bottom anti-reflective coating material.

10. The method of claim 1, wherein a gate dielectric layer is formed between the substrate and the dummy gate, and is made by a material including silicon oxide, silicon nitride, silicon oxynitride, TiN, TaN, or a high-k dielectric material.

11. The method of claim 1, wherein the dummy gate is made of a material including polysilicon, silicon nitride, or amorphous carbon.

12. The method of claim 1, further including:
    performing an oxygen vacancy removal treatment at the trench bottom after removing the trench footing.

13. The method of claim 12, wherein the oxygen vacancy removal treatment uses gases to remove oxygen vacancies including one or more of He, $CF_4$, $NF_3$ and $SF_6$.

14. The method of claim 13, wherein the gases also include $N_2$.

15. The method of claim 1, after the trench footing is removed, further comprising:
    forming a gate electrode in the trench, wherein the gate electrode has a top surface coplanar with the top surface of the interlayer dielectric layer.

16. A method for fabricating a transistor comprising:
providing a dummy gate on a substrate;
forming an interlayer dielectric layer on the substrate and sidewall surfaces of the dummy gate, wherein the interlayer dielectric layer has a top surface coplanar with a top surface of the dummy gate;
forming a mask layer on the top surface of the interlayer dielectric layer;
using the mask layer as an etch mask to remove the dummy gate by applying a dry etching process, wherein the dry etching process is a synchronized pulse etching process using a source power and a bias power, and the source power and the bias power in a pulse mode have a same frequency and a same phase.

17. The method of claim 16, after removing the dummy gate, further comprising:
forming a gate electrode, wherein the gate electrode has a top surface coplanar with the top surface of the interlayer dielectric layer.

* * * * *